US012628278B2

(12) United States Patent
Kim et al.

(10) Patent No.: US 12,628,278 B2
(45) Date of Patent: May 12, 2026

(54) DISPLAY MODULE AND ELECTRONIC DEVICE INCLUDING THE SAME

(71) Applicant: Samsung Electronics Co., Ltd., Suwon-si (KR)

(72) Inventors: Jaewan Kim, Suwon-si (KR); Junghyun Kim, Suwon-si (KR); Sangheon Park, Suwon-si (KR); Gyudong Eom, Suwon-si (KR); Dongseop Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 739 days.

(21) Appl. No.: 17/954,745

(22) Filed: Sep. 28, 2022

(65) Prior Publication Data

US 2023/0056094 A1      Feb. 23, 2023

Related U.S. Application Data

(63) Continuation of application No. PCT/KR2022/012604, filed on Aug. 23, 2022.

(30) Foreign Application Priority Data

Aug. 23, 2021      (KR) ........................ 10-2021-0110926

(51) Int. Cl.
*H05K 1/18*      (2006.01)
*H01L 23/00*      (2006.01)
(Continued)

(52) U.S. Cl.
CPC ........... *H05K 1/18* (2013.01); *H01L 23/5386* (2013.01); *H01L 24/05* (2013.01); *H01L 24/30* (2013.01);
(Continued)

(58) Field of Classification Search
None
See application file for complete search history.

(56) References Cited

U.S. PATENT DOCUMENTS

| | | | |
|---|---|---|---|
| 7,986,393 B2 | 7/2011 | Morita | |
| 10,761,627 B2 | 9/2020 | Kim et al. | |

(Continued)

FOREIGN PATENT DOCUMENTS

| | | | |
|---|---|---|---|
| JP | 5604457 B2 | 10/2014 | |
| JP | 6430341 B2 | 11/2018 | |

(Continued)

OTHER PUBLICATIONS

International Search Report dated Dec. 2, 2022, issued in International Patent Application No. PCT/KR2022/012604.

(Continued)

*Primary Examiner* — Lawrence C Tynes, Jr.
(74) *Attorney, Agent, or Firm* — Jefferson IP Law, LLP

(57)      ABSTRACT

An electronic device is provided. The electronic device includes a display panel, a first connection member on which a display driver integrated circuit (DDIC) configured to control the display panel is disposed, a first contact point part disposed on the first connection member, a second contact point part spaced apart from the first contact point part in a second direction perpendicular to the first direction and disposed on the first contact point part, a second connection member disposed adjacent to the first connection member, a third contact point part arranged in the first direction and is disposed on the first layer of the second connection member to be connected to the first contact point part, and a fourth contact point part arranged in the first direction and is arranged on the second layer of the second connection member to be connected to the second contact point part.

17 Claims, 8 Drawing Sheets

(51) Int. Cl.

| | |
|---|---|
| *H01L 23/538* | (2006.01) |
| *H01R 12/62* | (2011.01) |
| *H01L 25/16* | (2023.01) |
| *H10K 59/131* | (2023.01) |

(52) U.S. Cl.

CPC ............. *H01L 24/32* (2013.01); *H01R 12/62* (2013.01); *H01L 23/5387* (2013.01); *H01L 25/162* (2013.01); *H01L 25/167* (2013.01); *H01L 2224/05571* (2013.01); *H01L 2224/05573* (2013.01); *H01L 2224/3003* (2013.01); *H01L 2224/32227* (2013.01); *H05K 2201/049* (2013.01); *H05K 2201/10128* (2013.01); *H05K 2201/10727* (2013.01); *H10K 59/131* (2023.02)

(56) References Cited

U.S. PATENT DOCUMENTS

| | | |
|---|---|---|
| 2004/0081759 A1 | 4/2004 | Maruyama et al. |
| 2012/0139000 A1 | 6/2012 | Lee et al. |
| 2012/0154705 A1 | 6/2012 | Ahn |
| 2013/0194532 A1 | 8/2013 | Morita |
| 2015/0212538 A1 | 7/2015 | Lee et al. |
| 2015/0228706 A1 | 8/2015 | Lee |
| 2017/0040386 A1 | 2/2017 | Miyamoto et al. |
| 2018/0076235 A1 | 3/2018 | Kim et al. |
| 2020/0073497 A1 | 3/2020 | Motonishi et al. |
| 2020/0161337 A1 | 5/2020 | Song et al. |
| 2021/0064090 A1* | 3/2021 | Wen ..................... H01L 25/167 |
| 2021/0149521 A1 | 5/2021 | Tak et al. |

FOREIGN PATENT DOCUMENTS

| | | |
|---|---|---|
| KR | 10-2003-0051398 A | 6/2003 |
| KR | 10-1356340 B1 | 1/2014 |
| KR | 10-2015-0088489 A | 8/2015 |
| KR | 10-2015-0094829 A | 8/2015 |
| KR | 10-1764272 B1 | 8/2017 |
| KR | 10-2018-0021331 A | 3/2018 |
| KR | 10-2018-0029168 A | 3/2018 |
| KR | 10-1875048 B1 | 7/2018 |
| KR | 10-2019-0005354 A | 1/2019 |
| KR | 10-2019-0121254 A | 10/2019 |
| KR | 10-2020-0057141 A | 5/2020 |
| KR | 10-2212323 B1 | 2/2021 |
| KR | 10-2022-0008699 A | 1/2022 |

OTHER PUBLICATIONS

Korean Office Action dated Jul. 2, 2025, issued in a Koean Patent Application No. 10-2021-0110926.

* cited by examiner

DISPLAY MODULE AND ELECTRONIC DEVICE INCLUDING THE SAME

CROSS-REFERENCE TO RELATED APPLICATION(S)

This application is a continuation application, claiming priority under § 365(c), of an International application No. PCT/KR2022/012604, filed on Aug. 23, 2022, which is based on and claims the benefit of a Korean patent application number 10-2021-0110926, filed on Aug. 23, 2021, in the Korean Intellectual Property Office, the disclosure of which is incorporated by reference herein in its entirety.

TECHNICAL FIELD

The disclosure relates to a display module and an electronic device including the same. More particularly, the disclosure relates to a display module capable of securing an interval between patterns without increasing the width of connection members, and an electronic device including the same.

BACKGROUND ART

A display module may be a device for displaying visual information. A display module may be a device for converting electric signals processed by an electronic device into visual information. A display module may be electrically connected to a printed circuit board disposed inside an electronic device.

As a result of the decreasing size of electronic devices and the emergence of new formfactors (for example, foldable, rollable electronic devices), inner spaces of electronic devices in which components can be mounted have become narrower.

Accordingly, the free space that may be occupied by a display module and a constituent element connected to the display module is gradually reduced.

Therefore, a need exists for a display module capable of securing an interval between patterns without increasing the width of connection members, and an electronic device including the same.

The above information is presented as background information only to assist with an understanding of the disclosure. No determination has been made, and no assertion is made, as to whether any of the above might be applicable as prior art with regard to the disclosure.

DISCLOSURE

Technical Problem

There may be various methods for connecting a display module to a printed circuit board of an electronic device. For example, a connection member made of a flexible material may be used to connect a display module to a printed circuit board of an electronic device.

When multiple connection members are used, the connection members may be electrically connected. Multiple conductive patterns formed on connection members may be electrically connected to each other such that multiple connection members are electrically connected, thereby electrically connecting a display module and a printed circuit board.

Meanwhile, material that constitute patterns formed on connection members may be eluted for various reasons. If the interval between pattern is narrow, a short may occur between the patterns due to elution. Such a short may degrade the connection between the display module and the printed circuit board.

The narrow inner mounting space of the electronic device limits any increase in the width of the connection members in order to increase the interval between the patterns.

Aspects of the disclosure are to address at least the above-mentioned problems and/or disadvantages and to provide at least the advantages described below. Accordingly, an aspect of the disclosure is to provide a display module capable of securing an interval between patterns without increasing the width of connection members, and an electronic device including the same.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a display panel, a first connection member which includes multiple wires electrically connected to the display panel and on which a display driver integrated circuit (DDIC) configured to control the display panel is disposed, a first contact point part which includes multiple first pads electrically connected to some of the wires included in the first connection member and arranged in a first direction and is disposed on the first connection member, a second contact point part which includes multiple second pads electrically connected to other wires included in the first connection member and arranged in the first direction and is spaced apart from the first contact point part in a second direction perpendicular to the first direction and disposed on the first connection member, a second connection member which includes a second layer laminated on the first layer and multiple wires arranged on each of the layers and is disposed adjacent to the first connection member, a third contact point part which includes multiple third pads electrically connected to some of the wires included in the second connection member and arranged in the first direction and is disposed on the first layer of the second connection member to be connected to the first contact point part, and a fourth contact point part which includes multiple fourth pads electrically connected to other wires included in the second connection member and arranged in the first direction and is arranged on the second layer of the second connection member to be connected to the second contact point part.

In accordance with another aspect of the disclosure, a display module is provided. The display module includes a display panel, a first connection member which includes multiple wires electrically connected to the display panel and on which a display driver integrated circuit (DDIC) configured to control the display panel is disposed, a first contact point part which includes multiple first pads electrically connected to some of the wires included in the first connection member and arranged in a first direction and is disposed on the first connection member, a second contact point part which includes multiple second pads electrically connected to other wires included in the first connection member and arranged in the first direction and is spaced apart from the first contact point part in a second direction perpendicular to the first direction and disposed on the first connection member, a second connection member which includes a first layer, a second layer laminated on the first layer, and multiple wires arranged on each of the layers and is disposed adjacent to the first connection member, a third contact point part which includes multiple third pads electrically connected to some of the wires included in the second connection member and arranged in the first direction and is disposed on the first layer of the second connection member to be connected to the first contact point part, and a fourth contact point part which includes multiple fourth pads electrically connected to other wires included in the second connection member and arranged in the first direction and is arranged on the second layer of the second connection member to be connected to the second contact point part.

In accordance with another aspect of the disclosure, an electronic device is provided. The electronic device includes a display panel, a first connection member which includes multiple wires electrically connected to the display panel and on which a display driver integrated circuit (DDIC) configured to control the display panel is disposed, and a second connection member which includes a second layer laminated on the first layer and multiple wires arranged on each of the layers and is disposed adjacent to the first connection member, wherein the first connection member includes a first contact point part which includes multiple first pads electrically connected to some of the wires included in the first connection member and arranged in a first direction and is disposed on the first connection member, and a second contact point part which includes multiple second pads electrically connected to other wires included in the first connection member and arranged in the first direction and is spaced apart from the first contact point part in a second direction perpendicular to the first direction and disposed on the first connection member, and the second connection member includes a third contact point part which includes multiple third pads electrically connected to some of the wires included in the second connection member and arranged in the first direction and is disposed on the first layer of the second connection member and connected to the first contact point part, and a fourth contact point part which includes multiple fourth pads electrically connected to other wires included in the second connection member and arranged in the first direction and is arranged on the second layer of the second connection member and connected to the second contact point part.

Advantageous Effects

According to various embodiments of the disclosure disclosed herein, the durability of a connection member may be improved without increasing the width of the connection member for connecting a display module to a printed circuit board of an electronic device.

According to various embodiments of the disclosure, the interval between multiple patterns included in a connection member may be increased, thereby reducing a short occurring between the patterns due to elution of materials that constitute the patterns.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR INVENTION

Figure 1:
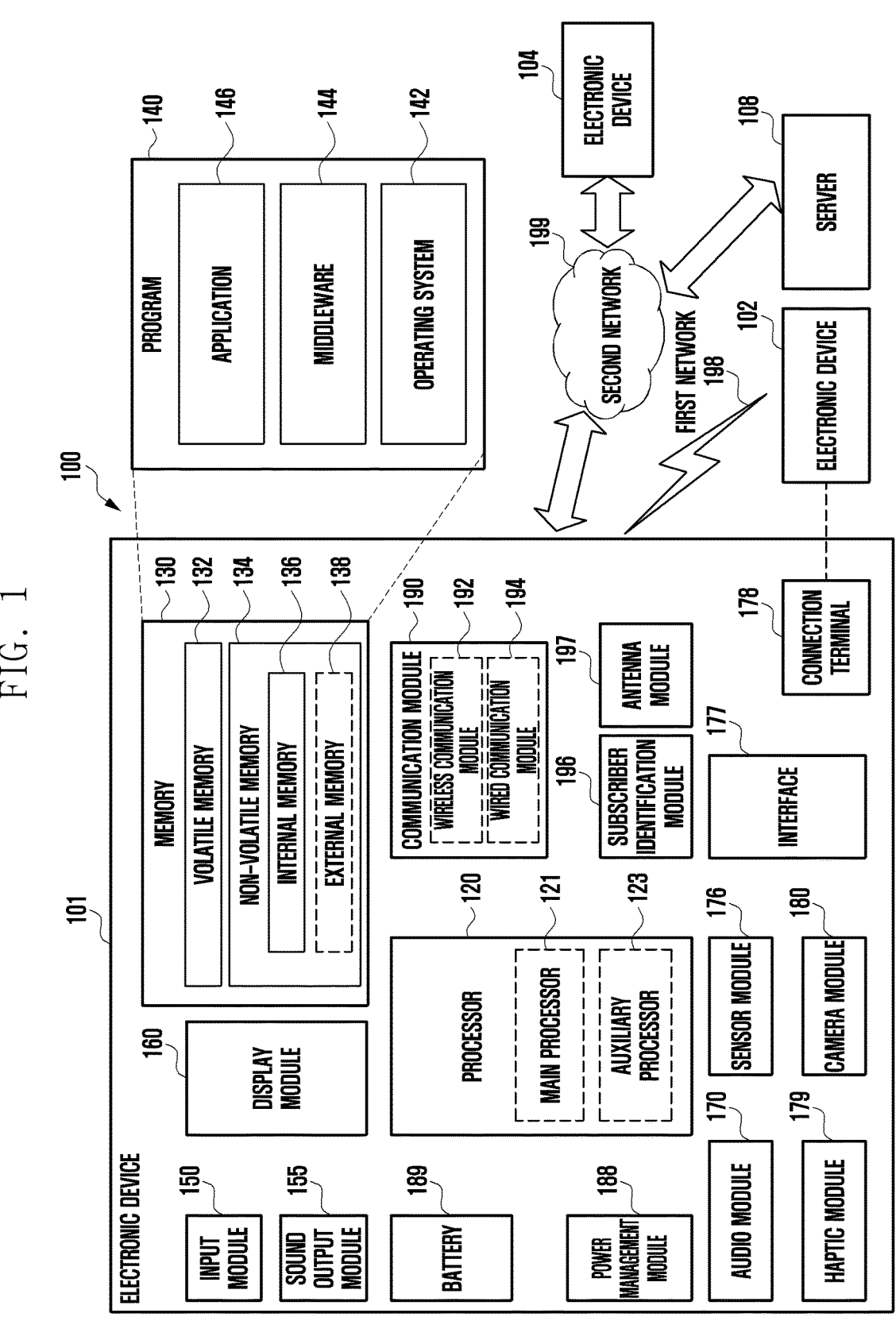
FIG. 1 is a block diagram of an electronic device in a network environment according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that various embodiments of the disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or at least one of an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one of the components (e.g., the connecting terminal 178) may be omitted from the electronic device 101, or one or more other components may be added in the electronic device 101. In some embodiments of the disclosure, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. The non-volatile memory 134 may include an internal memory 136 and an external memory 138. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor adapted to detect a touch, or a pressure sensor adapted to measure the intensity of force incurred by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., an external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5th generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., a printed circuit board (PCB)). According to an embodiment of the disclosure, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., smart home, smart city, smart car, or healthcare) based on 5G communication technology or IoT-related technology.

In connection with the below descriptions, unless otherwise stated, same or similar reference numerals will be used to refer to same or similar elements.

Figure 2:
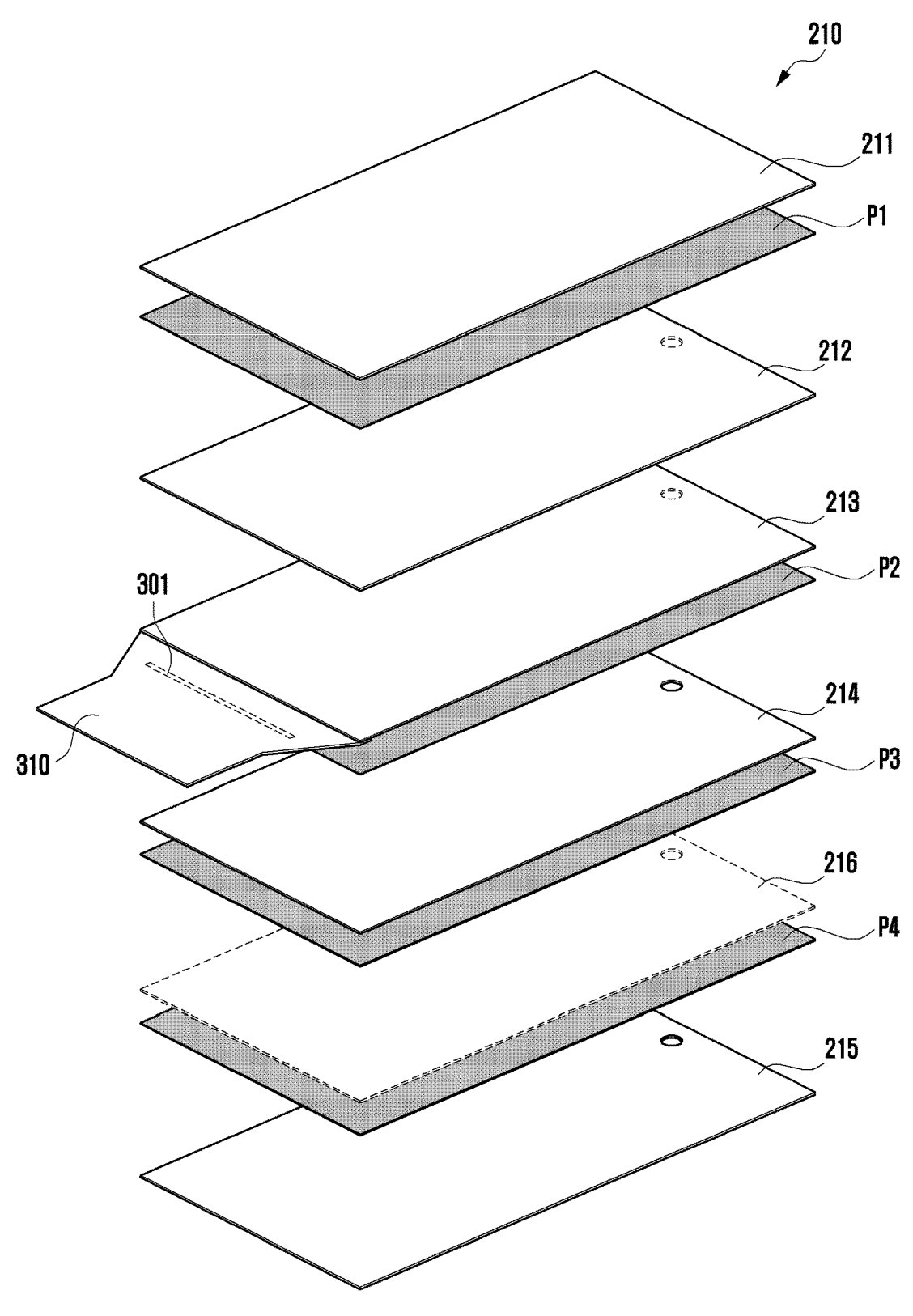
FIG. 2 is an exploded perspective view of a display module according to an embodiment of the disclosure.

FIG. 2 is an exploded perspective view of a display module according to an embodiment of the disclosure.

Referring to FIG. 2, in the below description, a display module 210 may be an example of the display module 160 described through FIG. 1. The display module 210 may mean a device configured to visually display information. The display module 210 may be understood as a set of elements configured to visually display information. The elements of the display module 210 illustrated in FIG. 2 may be merely an example of the elements included in the display module 210, the display module 210 may be configured by omitting some of the elements illustrated in FIG. 2, and the display module 210 may be configured by adding other elements other than elements illustrated in FIG. 2.

The display module 210 may include the on-cell touch active matrix organic light-emitting diode (AMOLED) (OCTA) type of a flat type display panel 213. In addition, the display module 210 may include an unbreakable (UB) type organic light emitting diode (OLED) display (e.g., a curved display) panel 213. In addition, a light-emitting element constituting the display panel 213 may be implemented as an inorganic light-emitting element made using an inorganic material, which is different from an organic light emitting diode (OLED) made using an organic material. According to various embodiments of the disclosure, the light-emitting element may be a micro light emitting diode (LED) ($\mu$-LED). The micro LED may mean an ultra-small inorganic light-emitting element which emits light by itself without a backlight or a color filter and has a size of 100 micrometers ($\mu$m) or less.

Referring to FIG. 2, the display module 210 may include a window layer 211, and a polarizer (POL) 212 (e.g., a polarization film), a display panel 213, a polymer layer 214, and a metal sheet layer 215 which are sequentially arranged on the rear surface of the window layer 211. In some embodiments of the disclosure, the display panel 213 may include a digitizer panel 216 disposed between the polymer layer 214 and the metal sheet layer 215 or on the rear surface of the metal sheet layer 215.

According to various embodiments of the disclosure, the window layer 211 may include a glass layer. According to one embodiment of the disclosure, the window layer 211 may include an ultra-thin glass (UTG). In some embodiments of the disclosure, the window layer 211 may also include polymer. In the case, the window layer 211 may include polyethylene terephthalate (PET) or polyimide (PI). In some embodiments of the disclosure, the window layer 211 may be disposed in multiple layers to allow a glass layer and polymer to be included therein.

According to one embodiment of the disclosure, the window layer 211, the polarizer 212, the display panel 213, the polymer layer 214, and the metal sheet layer 215 may be attached to each other through viscous materials P1, P2, P3, and P4 (or adhesives). For example, the viscous materials P1, P1, P2, and P3 may include at least one of an optical clear adhesive (OCA), a pressure sensitive adhesive (PSA), a thermally responsive adhesive, a general adhesive, or a double-sided tape.

According to various embodiments of the disclosure, the display panel 213 may include multiple pixels and a wire structure (e.g., an electrode pattern). According to one embodiment of the disclosure, the polarizer 212 may be configured to allow light, which is generated from a light source of the display panel 213 and vibrates in a predetermined direction, to selectively pass therethrough. According to one embodiment of the disclosure, the display panel 213 and the polarizer 212 may be integrally formed. According to one embodiment of the disclosure, the display module 213 may include a touch panel (not shown). Elements included in the display panel 213 may be arranged on a substrate (e.g., the substrate 213-2 of FIG. 5) of the display panel 213. The substrate of the display panel may be made of a rigid material, such as glass. In some embodiments of the disclosure, the substrate of the display panel may be made of a flexible material. For example, the substrate may be made of a flexible material, such as polyimide (PI), polyethylene terephthalate (PET), or ultra-thin-glass (UTG).

According to various embodiments of the disclosure, the polymer layer 214 may be disposed under the display panel 213 to provide a dark background for securing visibility of the display panel 213, and may be made of a buffer material (e.g., a cushion) for a buffer function. For example, the polymer layer 214 may include an opaque metal layer (e.g., a black layer including a bumpy pattern) configured to remove air bubbles which may be generated between the display panel 213 and attachments therebelow and to block light generated in the display panel 213 or light incident from the outside, and/or a buffer layer (e.g., a sponge layer) disposed to mitigate impact. In some embodiments of the disclosure, in order to waterproof the display module 210, the polymer layer 214 may be removed or may be disposed under the metal sheet layer 215.

According to one embodiment of the disclosure, the metal sheet layer 215 may include at least one of steel use stainless (SUS) (e.g., stainless steel (STS)), Cu, Al, or a metal CLAD (e.g., a laminated member in which SUS and Al are alternately arranged). In some embodiments of the disclosure, the metal sheet layer 215 may also include other alloy materials. In some embodiments of the disclosure, the metal sheet layer 215 may help rigidity reinforcement of an electronic device 200, may block ambient noise, and may be used for dispersing heat radiated from heat-dissipating components therearound. Although FIG. 2 illustrates that the metal sheet layer 215 has the same area as the display panel 213, in some embodiments of the disclosure, the metal sheet layer 215 may be disposed on a portion of the display panel 213. In some cases, the metal sheet layer 215 may be omitted.

According to an embodiment of the disclosure, the electronic device may be a foldable electronic device in which at least a part of the display module 210 is folded. For example, in a case where the electronic device is a foldable electronic device, the metal sheet layer 215 may provide a flexural (e.g., a flexible) characteristic to the display module 210. According to an embodiment of the disclosure, at least a part of the metal sheet layer 215 may include a bendable part (not shown), and the bendable part (not shown) may include multiple openings formed with designated gaps to contribute to the flexural characteristic of the display module 210. In some embodiments of the disclosure, the bendable part (not shown) may include multiple recesses formed with designated gaps. For example, the flexural characteristic of the display module 210 may be determined and/or changed according to the number, the arrangement density, and/or the shape of the multiple openings.

According to various embodiments of the disclosure, the digitizer panel 216 may be disposed between the metal sheet layer 215 and the polymer layer 214. In some cases, the digitizer panel 216 may be disposed under the metal sheet layer 215. The digitizer panel 216 may be a detection member configured to receive an input of a pen input device (e.g., a stylus). In an embodiment of the disclosure, the digitizer panel 216 may include multiple conductive patterns (not shown). For example, the digitizer panel 216 may include multiple conductive loops. Current flowing through multiple conductive loops may form a magnetic field. When an external electronic device (e.g., a stylus, or the cover device 300) including a coil approaches the magnetic field formed by the digitizer panel 216, a resonance frequency may be generated. The resonance frequency may be determined according to inductance or capacitance of the external electronic device. A digitizer circuit 240 configured to control an operation of the digitizer panel 216 may recognize a specific frequency and a position at which a specific frequency is recognized, by using the multiple conductive loops included in the digitizer panel 216. For example, when the pen input device approaches the digitizer panel 216, the digitizer circuit 240 may identify the generation of the resonant frequency of the pen input device and the generation position thereof. Through this, the pen input of the pen input device may be recognized.

According to various embodiments of the disclosure, the display module 210 may also include at least one functional member (not shown) disposed between the polymer layer 214 and the metal sheet layer 215 or under the metal sheet layer 215. According to one embodiment of the disclosure, the functional member may include a graphite sheet for heat dissipation, a touch sensor for supporting a touch function of the display module 210, a force touch FPCB, a fingerprint sensor FPCB, an antenna radiation body for communication, or a conductive/non-conductive tape.

According to various embodiments of the disclosure, the display module 210 may include a first connection member 310 disposed in a folding (e.g., bending) manner of being folded from the display panel 213 to at least a partial area of the rear surface of the display module 210. According to one embodiment of the disclosure, the first connection member 310 may be electrically connected to the display panel 213. The first connection member 310 may include a display driver integrated circuit (DDIC) 301. A second connection member (e.g., the second connection member 320 of FIG. 3) connected to the first connection member 310 may include a touch display driver integrated circuit (TDDI) (not shown). In some embodiments of the disclosure, the first connection member 310 connected to the display panel 213 may include both the DDIC 301 and the TDDI.

In an embodiment of the disclosure, the first connection member 310 may be integrally formed with the substrate of the display panel 213. The first connection member 310 may be a part of the substrate on which a light-emitting element of the display panel 213 is disposed. The first connection member 310 may include a portion which is configured to extend from the substrate of the display panel 213 and at least a part of which is deformed to extend toward the rear surface of the display panel 213. In an embodiment of the disclosure, the display module 210 may include a chip on panel (COP) structure in which the DDIC 301 is disposed on the first connection member 310 integrally formed with the substrate of the display panel 213.

In an embodiment of the disclosure, the first connection member 310 may be formed separately from the substrate of the display panel 213 and may be electrically connected to the display panel 213. In the case, the first connection member 310 may be a printed circuit board (e.g., a flexible printed circuit board (FPCB)) made of a flexible material. The first connection member 310 connected to the display panel 213 may have a portion which is deformed to allow the first connection member to extend to the rear surface of the display panel 213. In an embodiment of the disclosure, the display module 210 may include a chip on film (COF) structure in which the DDIC 301 is disposed on the first connection member 310 electrically connected to the display panel 213.

According to various embodiments of the disclosure, various elements associated with driving of the display module 210 may be arranged on the first connection member 310. For example, a flash memory for display, a diode for preventing electrostatic discharge (ESD), a pressure sensor, and/or a passive element, such as a decap may be disposed on the first connection member 310.

Figure 3:
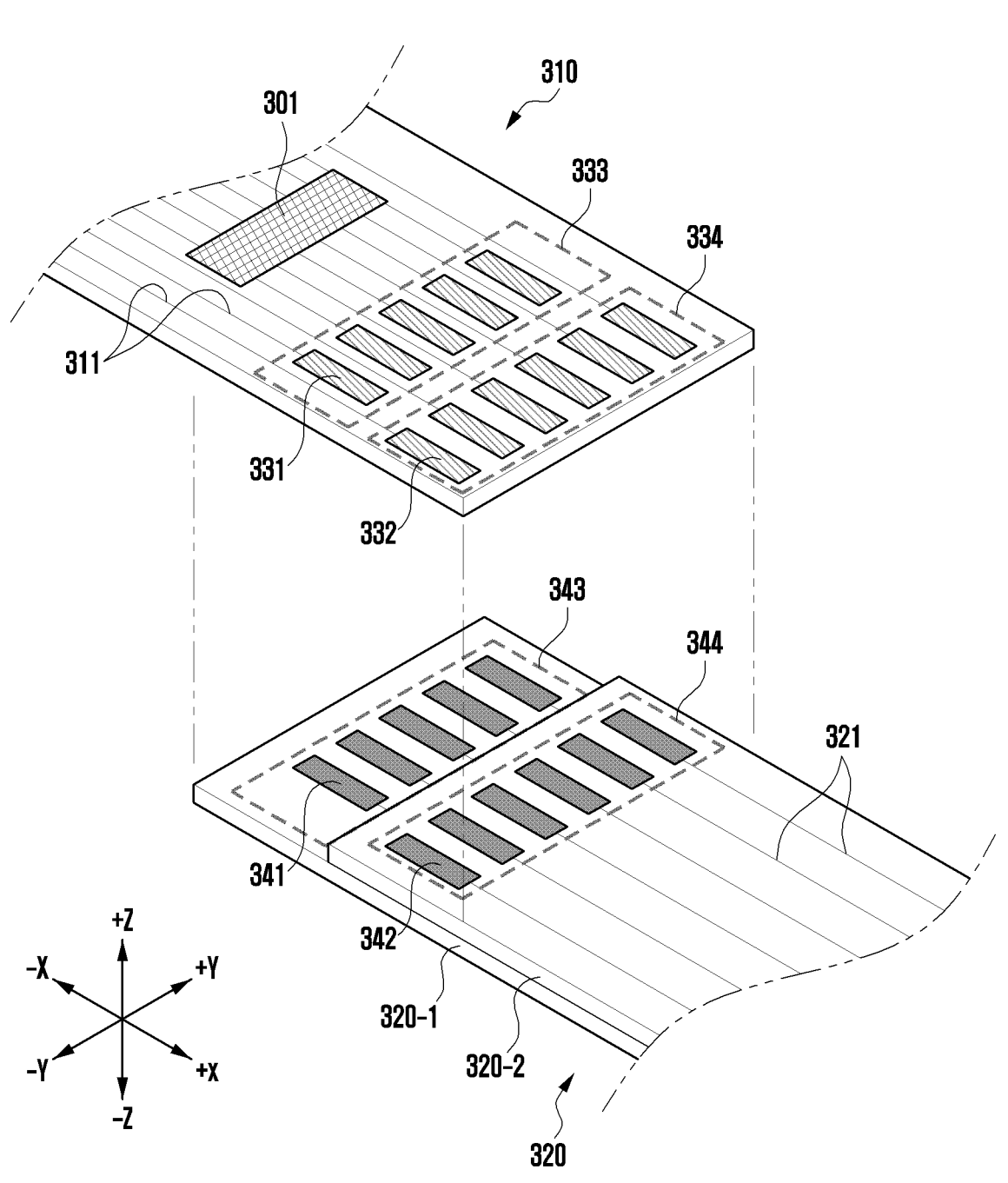
FIG. 3 is an exploded perspective view of a first connection member and a second connection member of a display module according to an embodiment of the disclosure.

FIG. 3 is an exploded perspective view of a first connection member and a second connection member of a display module according to an embodiment of the disclosure.

Referring to FIG. 3, according to various embodiments of the disclosure, the first connection member 310 may be electrically connected to a display panel (e.g., the display panel 213 of the FIG. 5) on which multiple pixels (e.g., the active layer 213-1 of FIG. 5) are arranged. The first connection member 310 may include multiple wires 311. The multiple wires included in the first connection member may be a conductive material disposed on the first connection member 310 in various ways. Various electrical signals for driving a display module (e.g., the display module 210 of FIG. 2) may be transmitted through the multiple wires. In addition, power for the operation of the display module 210 and the DDIC 301 may be transmitted through the wires included in the first connection member 310. Some of the multiple wires may be introduced into or withdrawn out of the DDIC 301. According to an embodiment of the disclosure, among the multiple wires, wires introduced into or withdrawn out of the DDIC 301 may enable power associated with driving of multiple pixels and the DDIC 301 of the display module 210 to be transferred thereto, and the other wires may enable information associated with image data to be displayed on the display module 210 to be transferred thereto.

Referring to FIG. 3, the first connection member 310 may include multiple pads. The first connection member 310 may include a first pad 331 and a second pad 332.

In an embodiment of the disclosure, the first pad 331 may be pads arranged in a first direction (e.g., the Y axis direction of FIG. 3). The first pad 331 may be electrically connected to some of the multiple wires 311 included in the first connection member 310. In an embodiment of the disclosure, the first pad 331 may be at least a part of a portion through which the multiple wires 311 included in the first connection member 310 are exposed to the outside. For example, the first pad 331 may be an exposed portion by which a protective layer (not shown) configured to surround the first connection member 310 is partially removed in order for contact with other electrical objects. The first pad 331 may be understood as a contact pad for electrical contact with other units. Although FIG. 3 illustrates that the first pad 331 has a relatively large width compared to each of the multiple wires 311 included in the first connection member 310, the first pad 331 may be formed to have a width substantially identical to that of the wire 311 included in the first connection member 310. In addition, the first pad 331 may be formed separately from the multiple wires 311 and may be disposed on the first connection member 310. For example, the first pad 331 may be formed to have a width larger than that of the wire 311 included in the first connection member 310 in order for contact with other electrical objects. The first pads 331 arranged in the first direction may constitute a first contact point part 333 for electrical connection of the first connection member 310.

In an embodiment of the disclosure, the second pad 332 may be pads arranged in the first direction, similarly to the first pad 331. The second pad 332 may be electrically connected to some of the multiple wires 311 included in the first connection member 310. The wires connected to the second pad 332 may be different from the wires connected to the first pad 331. Similarly to the first pad 331, the second pad 332 may be at least a part of a portion through which the multiple wires 311 included in the first connection member 310 are exposed to the outside. For example, the second pad 332 may be an exposed portion by which a protective layer configured to surround the first connection member 310 is partially removed in order for contact with other electrical objects. The second pad 332 may be understood as a contact pad for electrical contact with other units. The second pad 332 may be disposed to be spaced apart with respect to the first pad 331 in a second direction (e.g., the +X axis direction of FIG. 3). The second direction may be a direction substantially perpendicular to the first direction. Although FIG. 3 illustrates that the second pad 332 has a relatively large width compared to each of the multiple wires 311 included in the first connection member 310, the second pad 332 may be formed to have a width substantially identical to that of the wire 311 included in the first connection member 310. In addition, the second pad 332 may be formed separately from the multiple wires 311 and may be disposed on the first connection member 310. For example, the second pad 332 may be formed to have a width larger than that of the wire 311 included in the first connection member 310 in order for contact with other electrical objects. The second pads 332 arranged in the first direction may constitute a second contact point part 334 for electrical connection of the first connection member 310.

Referring to FIG. 3, the first contact point part 333 including the first pad 331 and the second contact point part 334 including the second pad 332 may be arranged to be spaced apart from each other in the second direction. It may be understood that, in the first connection member 310, the first contact point part 333 and the second contact point part 334 are arranged in different rows. In an embodiment of the disclosure, the first pad 331 of the first contact point part 333 and the second pad 332 of the second contact point part 334 may be formed on the same layer on the first connection member 310.

According to various embodiments of the disclosure, the second connection member 320 may be configured to electrically connect the first connection member 310 to a printed circuit board (not shown) of an electronic device (e.g., the electronic device 101 of FIG. 1). Here, the printed circuit board of the electronic device may be a printed circuit board on which a processor (e.g., the processor 120 of FIG. 1) of the electronic device is disposed or which is connected to a processor. The second connection member 320 may be electrically connected to the first connection member 310. The second connection member 320 may be made of a flexible material. The second connection member 320 may include multiple layers. For example, the second connection member 320 may include a first layer 320-1 and a second layer 320-2 laminated on the first layer 320-1. With reference to FIG. 3, the second layer 320-2 may be laminated in the +Z direction with respect to the first layer 320-1. The second connection member 320 may include multiple wires 321. In an embodiment of the disclosure, the multiple wires 321 included in the second connection member 320 may be arranged on the multiple layers of the second connection member 320. For example, some of the multiple wires 321 may be arranged on the first layer 320-1, and some thereof may be arranged on the second layer 320-2. The multiple wires 321 arranged on different layers may be electrically connected to each other through a VIA structure (e.g., the VIAs 410, 420, and 430 of FIG. 4) configured to penetrate a layer.

In an embodiment of the disclosure, the second connection member 320 may include multiple pads. For example, the second connection member 320 may include a third pad 341 and a fourth pad 342. In an embodiment of the disclosure, the third pad 341 and the fourth pad 342 may be arranged on different layers. For example, the third pad 341 may be disposed on the first layer 320-1, and the fourth pad 342 may be disposed on the second layer 320-2.

In an embodiment of the disclosure, the third pad 341 disposed on the first layer 320-1 of the second connection member 320 may be pads arranged in the first direction. The third pad 341 may be electrically connected to some of the multiple wires 321 included in the second connection member 320. The third pad 341 may be at least a part of a portion configured to allow the multiple wires 321 included in the second connection member 320 to be exposed to the outside. For example, the third pad 341 may be an exposed portion by which a protective layer configured to surround the second connection member 320 is partially removed in order for contact with other electrical objects. The third pad 341 may be understood as a contact pad for electrical contact with other units. Although FIG. 3 illustrates that the third pad 341 has a relatively large width compared to each of the multiple wires 321 included in the second connection member 320, the third pad 341 may be formed to have a width substantially identical to that of the wire 321 included in the second connection member 320. In addition, the third pad 341 may be formed separately from the multiple wires 321 and may be disposed on the second connection member 320. For example, the third pad 341 may be formed to have a width larger than that of the wire 321 included in the second connection member 320 in order for contact with other electrical objects. The third pad 341 arranged in the first direction may constitute a third contact point part 343 for electrical connection of the second connection member 320.

In an embodiment of the disclosure, the fourth pad 342 disposed on the second layer 320-2 of the second connection member 320 may be pads arranged in the first direction. The fourth pad 342 may be electrically connected to some of the multiple wires 321 included in the second connection member 320. The wires connected to the fourth pad 342 may be different from the wires connected to the third pad 343. The fourth pad 342 may be at least a part of a portion configured to allow the multiple wires 321 included in the second connection member 320 to be exposed to the outside. For example, the fourth pad 342 may be an exposed portion by which a protective layer configured to surround the second connection member 320 is partially removed in order for contact with other electrical objects. The fourth pad 342 may be understood as a contact pad for electrical contact with other units. Although FIG. 3 illustrates that the fourth pad 342 has a relatively large width compared to each of the multiple wires 321 included in the second connection member 320, the fourth pad 342 may be formed to have a width substantially identical to that of the wire 321 included in the second connection member 320. In addition, the fourth pad 342 may be formed separately from the multiple wires 321 and may be disposed on the second connection member 320. For example, the fourth pad 342 may be formed to have a width larger than that of the wire 321 included in the second connection member 320 in order for contact with other electrical objects. The fourth pad 342 arranged in the first direction may constitute a fourth contact point part 344 for electrical connection of the second connection member 320.

As illustrated in FIG. 3, the third contact point part 343 and the fourth contact point part 344 of the second connection member 320 may be formed on different layers. The third contact point part 343 and the fourth contact point part 344 may be understood to be spaced apart from each other in the Z axis direction with reference to FIG. 3. In addition, the fourth contact point part 344 may be spaced apart with respect to the third contact point part 343 in the second direction.

According to various embodiments of the disclosure, the process of forming the wire 311 on the first connection member 310 may be a micro-process compared to the process of forming the wire 321 on the second connection member 320. The width of each of the multiple wires 311, the first pad 331, and the second pad 332, which are included in the first connection member 310, may be smaller than that of each of the multiple wires 321, the third pad 341, and the fourth pad 342 which are included in second connection member 320. For example, each of the multiple wires 311 may be formed to have a width of about 10 μm, and each of the multiple wires 321 may be formed to have a width of about 50 μm.

Figure 4:
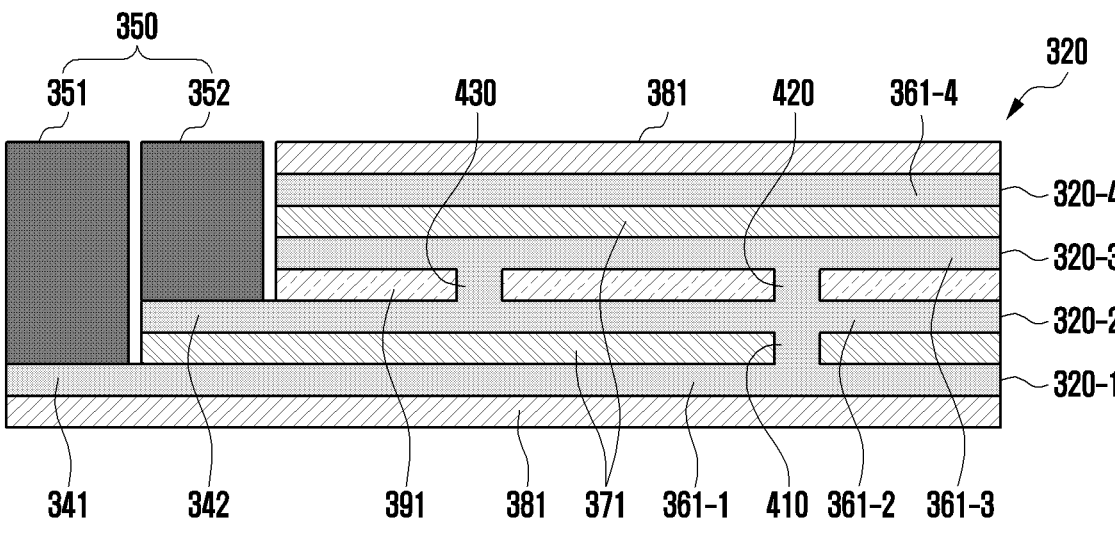
FIG. 4 is a sectional schematic view of a second connection member according to an embodiment of the disclosure.
Figure 4:
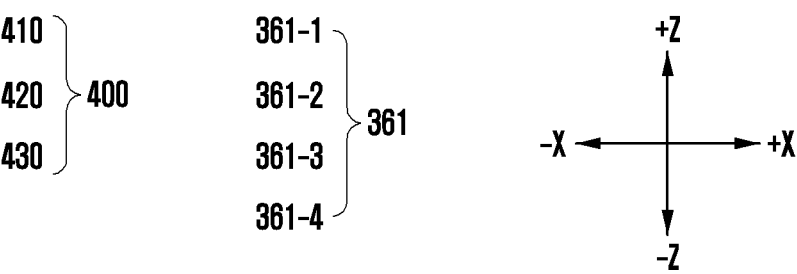

FIG. 4 is a sectional schematic view of a second connection member according to an embodiment of the disclosure.

Figure 5:
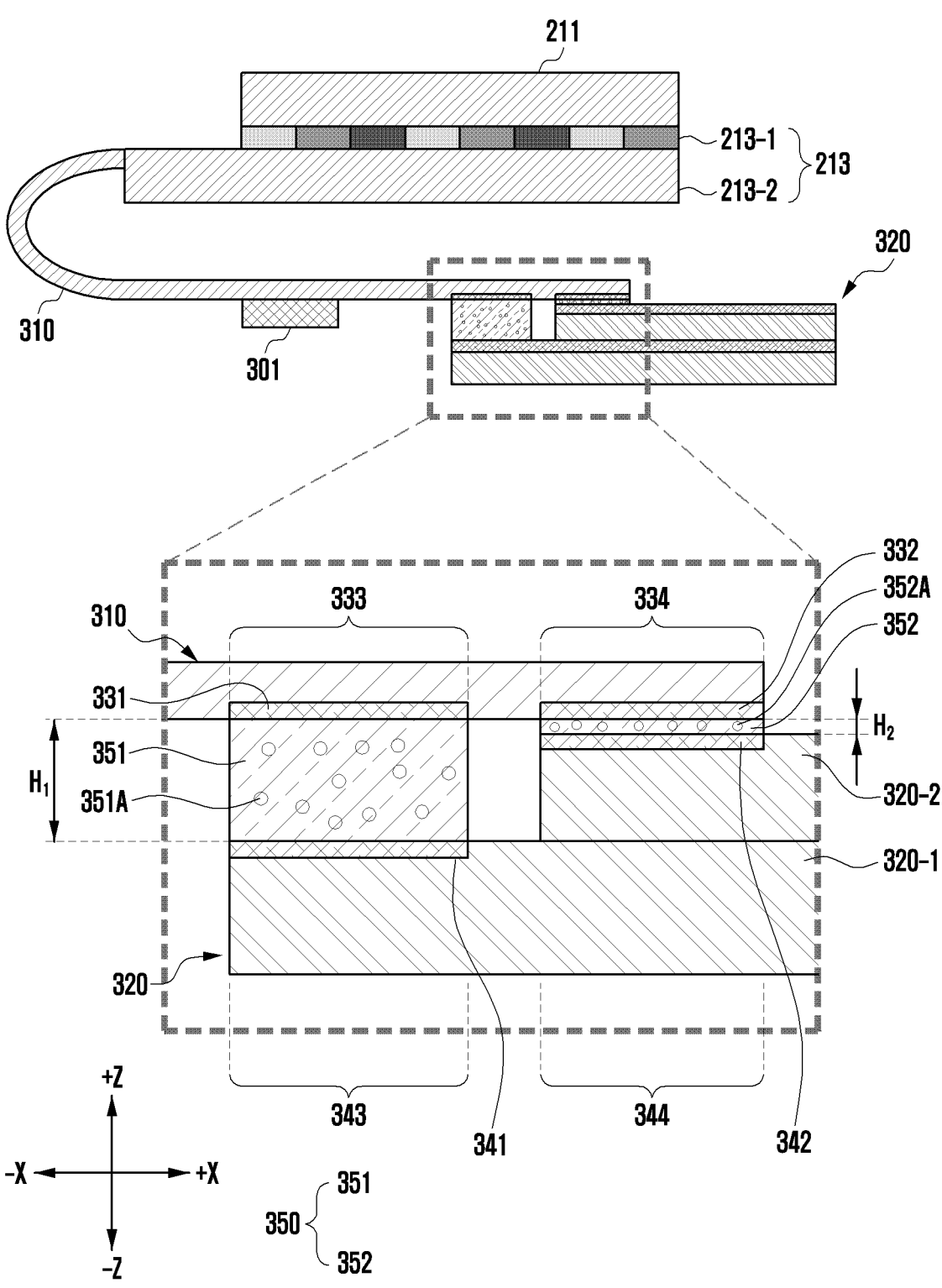
FIG. 5 is a sectional view of a display panel, a first connection member, and a second connection member according to an embodiment of the disclosure.

FIG. 5 is a sectional view of a display panel, a first connection member, and a second connection member according to an embodiment of the disclosure.

Referring to FIGS. 4 and 5, in an embodiment of the disclosure, the display panel 213 may include an active layer (e.g., the active layer 213-1 of FIG. 5) including a light-emitting element and a substrate (e.g., the substrate 213-2 of FIG. 5) on which the active layer 213-1 is disposed. The active layer 213-1 may include elements (e.g., a wire structure, a light-emitting element, and a thin film transistor (TFT)) for displaying visual information. A substrate 213-2 of the display panel 213 may be formed of a flexible material. For example, the substrate may be formed of a flexible material, such as polyimide (PI), polyethylene terephthalate (PET), or ultra-thin-glass (UTG). As illustrated in FIG. 5, the substrate 213-2 may have a portion which is deformed to allow the substrate to extend to the rear surface (e.g., a surface facing the −Z axis direction with reference to FIG. 5) of the display panel 213.

According to various embodiments of the disclosure, the second connection member 320 may be disposed to face the rear surface of the display panel 231. The first connection member 310 configured to extend to the rear surface of the display panel 213 may be electrically connected to the second connection member 320.

According to various embodiments of the disclosure, the second connection member 320 may include multiple layers (e.g., the first layer 320-1, the second layer 320-2, a third layer 320-3, and a fourth layer 320-4). The second connection member 320 may include a conductive layer 361, a protective layer 381, a film layer 371, and an adhesive layer 391.

According to various embodiments of the disclosure, the film layer 371 may be a base layer to allow the conductive layer 361 included in the second connection member 320 to be disposed thereon. The conductive layer 361 may be disposed on the film layer 371 in various manners.

According to various embodiments of the disclosure, the adhesive layer 391 may be an element for adhering the multiple layers included in the second connection member 320 thereto. In an embodiment of the disclosure, the adhesive layer 391 may include an insulating material and an adhesive material arranged between the multiple layers. For example, multiple pre-impregnated (PREPREG) material (PPG) layers (e.g., an insulating resin layer or an epoxy) may be included therein.

According to various embodiments of the disclosure, the protective layer 381 may be a layer disposed to at least partially surround the outside of the second connection member 320. The protective layer 381 may be an element configured to protect the second connection member 320 from external foreign matters. For example, the protective layer 381 may be a layer formed through a photo solder resist (PSR) process.

According to various embodiments of the disclosure, the conductive layer 361 may be understood as constituting the multiple wires (e.g., the multiple wires 321 of FIG. 3) included in the second connection member 320.

"Layers (e.g., the first layer 320-1 and the second layer 320-2)" used herein may be divided as a conductive layer 361 configured to implement an electrical connection in the second connection member 320. As illustrated in FIG. 4, the second connection member 320 may include the multiple conductive layers 361. For example, the second connection member 320 may include a first conductive layer 361-1, a second conductive layer 361-2, a third conductive layer 361-3, and a fourth conductive layer 361-4. The first conductive layer 361-1 may be understood as being disposed on the first layer 320-1, the second conductive layer 361-2 may be understood as being disposed on the second layer 320-2, the third conductive layer 361-3 may be understood as being disposed in the third layer 360-3, and the fourth conductive layer 361-4 may be understood as being disposed on the fourth layer 360-4.

In an embodiment of the disclosure, the conductive layers 361 arranged on different layers may be electrically connected by a VIA structure 400. The VIA structure 400 may include a structure in which a conductive material is filled in a hole formed to penetrate the adhesive layer 391 and/or the film layer 371 disposed between the conductive layers 361.

In an embodiment of the disclosure, the first conductive layer 361-1 may be connected to the second conductive layer 361-2 through a first VIA 410. The second conductive layer 361-2 may be connected to the third conductive layer 361-3 through a second VIA 420 or a third VIA 430. The third conductive layer 361-3 may be electrically connected to the printed circuit board of the electronic device. The first conductive layer 361-1 may be connected to the printed circuit board through a connection path of the first VIA 410—the second conductive layer 361-2—the second VIA 420—the third conductive layer 361-3. The second conductive layer 361-2 may be connected to the printed circuit board through a connection path of the third VIA 430—the third conductive layer 361-3. The connection path between the first conductive layer 361-1 and the printed circuit board and the connection path between the second conductive layer 361-2 and the printed circuit board may be separated from each other. The connection path described above may be merely an example, and the connection path between the first conductive layer 361-1 and the printed circuit board and the connection path between the second conductive layer 361-2 and the printed circuit board may be variously configured.

In an embodiment of the disclosure, the third pad 341 of the second connection member 320 may be electrically connected to the first conductive layer 361-1 disposed on the first layer 320-1, or may include a portion configured to allow a part of the first conductive layer 361-1 to be exposed to the outside of the second connection member 320. The fourth pad 342 of the second connection member 320 may be electrically connected to the second conductive layer 361-2 disposed on the second layer 320-2 laminated on the first layer 320-1, or may include a portion configured to allow a part of the second conductive layer 361-2 to be exposed to the outside of the second connection member 320. For example, the meaning of being exposed to the outside may include that the above those are not surrounded by the protective layer 381 and thus exposed to the outside of the second connection member 320.

In an embodiment of the disclosure, a first conductive member 351 may be disposed on the third pad 341, and a second conductive member 352 may be disposed on the fourth pad 342. A conductive member 350 will be described below.

Referring to FIGS. 3 and 5, the elements of the first connection member 310 and the second connection member 320 may be formed to at least partially overlap each other in the z-axis direction and/or the x-axis direction. For example, when seen from the z-axis direction, the first pad 331 and the second pad 332 may be formed to at least partially overlap each other in the x-axis direction. In addition, the third pad 341 and the fourth pad 342 may be formed to at least partially overlap each other in the x-axis direction. For another example, when seen from the x-axis direction, the first pad 331 and the second pad 332 may be formed to at least partially overlap each other in the z-axis direction. In addition, the third pad 341 and the fourth pad 342 may be formed to at least partially overlap each other in the z-axis direction.

As illustrated in FIG. 5, the first connection member 310 and the second connection member 320 may be electrically connected to each other. The electrical connection between the first connection member 310 and the second connection member 320 may be implemented through the connection between the first contact point part 333 and the third contact point part 343 and the connection between the second contact point part 334 and the fourth contact point part 344. The first pad 331 included in the first contact point part 333 and the third pad 341 included in the third contact point part 343 may be connected to each other, and thus the first connection member 310 and the second connection member 320 may be electrically connected. The second pad 332 included in the second contact point part 334 and the fourth pad 342 included in the fourth contact point part 344 may be connected to each other, and thus the first connection member 310 and the second connection member 320 may be electrically connected. When the first connection member 310 electrically connected to the display panel 213 is electrically connected to the second connection member 320, the printed circuit board of the electronic device, which is electrically connected to the second connection member 320, may be electrically connected to the display panel 213.

Referring to FIG. 5, the conductive member 350 may be disposed between the first contact point part 333 and the third contact point part 343 and between the second contact point part 334 and the fourth contact point part 344. For example, the conductive member 350 may be a conductive adhesive member (e.g., an anisotropic conductive film (ACF)) having adhesive properties. The first conductive member 351 disposed between the first contact point part 333 and the third contact point part 343 may be configured to electrically connect the first pad 331 of the first contact point part 333 and the third pad 341 of the third contact point part 343. In an embodiment of the disclosure, the first conductive member 351 may include a first conductive ball 351A. The first conductive ball 351A may include a ball-shaped material made of a conductive material. The second conductive member 352 disposed between the second contact point part 334 and the fourth contact point part 344 may be configured to electrically connect the second pad 332 of the second contact point part 334 and the fourth pad 342 of the fourth contact point part 344. In an embodiment of the disclosure, the second conductive member 352 may include a second conductive ball 352A. The second conductive ball 352A may include a ball-shaped material made of a conductive material.

As illustrated in FIG. 5, the third contact point part 343 and the fourth contact point part 344 of the second connection member 320 may be arranged on different layers, and thus the distance H1 and the distance H2 of the third contact point part 343 and the fourth contact point part 344 with respect to the first connection member 310 may be different from each other. Referring to FIG. 5, the distance H1 between the first connection member 310 and the third contact point part 343 disposed on the first layer 320-1 may be greater than the distance H2 between the first connection member 310 and the fourth contact point part 344 disposed on the second layer 320-2 laminated on the first layer 320-1. The thickness of the first conductive member 351 disposed between the first contact point part 333 and the third contact point part 343 may be thicker than the thickness of the second conductive member 352 disposed between the second contact point part 334 and the fourth contact point part 344. A diameter (or size) of the first conductive ball 351A included in the first conductive member 351 may be greater than a diameter (or size) of the second conductive ball 352A included in the second conductive member 352. The size of the first conductive ball 351A included in the first conductive member 351 may be relatively greater than the size of the second conductive ball 352A. Therefore, although the first conductive member 351 is thickly formed, the contacts of the first conductive balls 351A included in the first conductive member 351 may be more smoothly achieved. Therefore, the first conductive member 351, which is thickly formed, may stably maintain an electrical connection between the first contact point part 333 and the third contact point part 343.

In an embodiment of the disclosure, the diameters (or sizes) of the first conductive balls 351A included in the first conductive member 351 may be different from each other. For example, the first conductive ball 351A may include a $(1\text{-}1)^{st}$ conductive ball (not shown) having a first size and a $(1\text{-}2)^{nd}$ conductive ball (not shown) having a second size smaller than the first size. In an embodiment of the disclosure, the $(1\text{-}2)^{nd}$ conductive ball (not shown) may have a diameter (or size) substantially the same as that of the second conductive ball 352A of the second conductive member 352.

Figure 6:
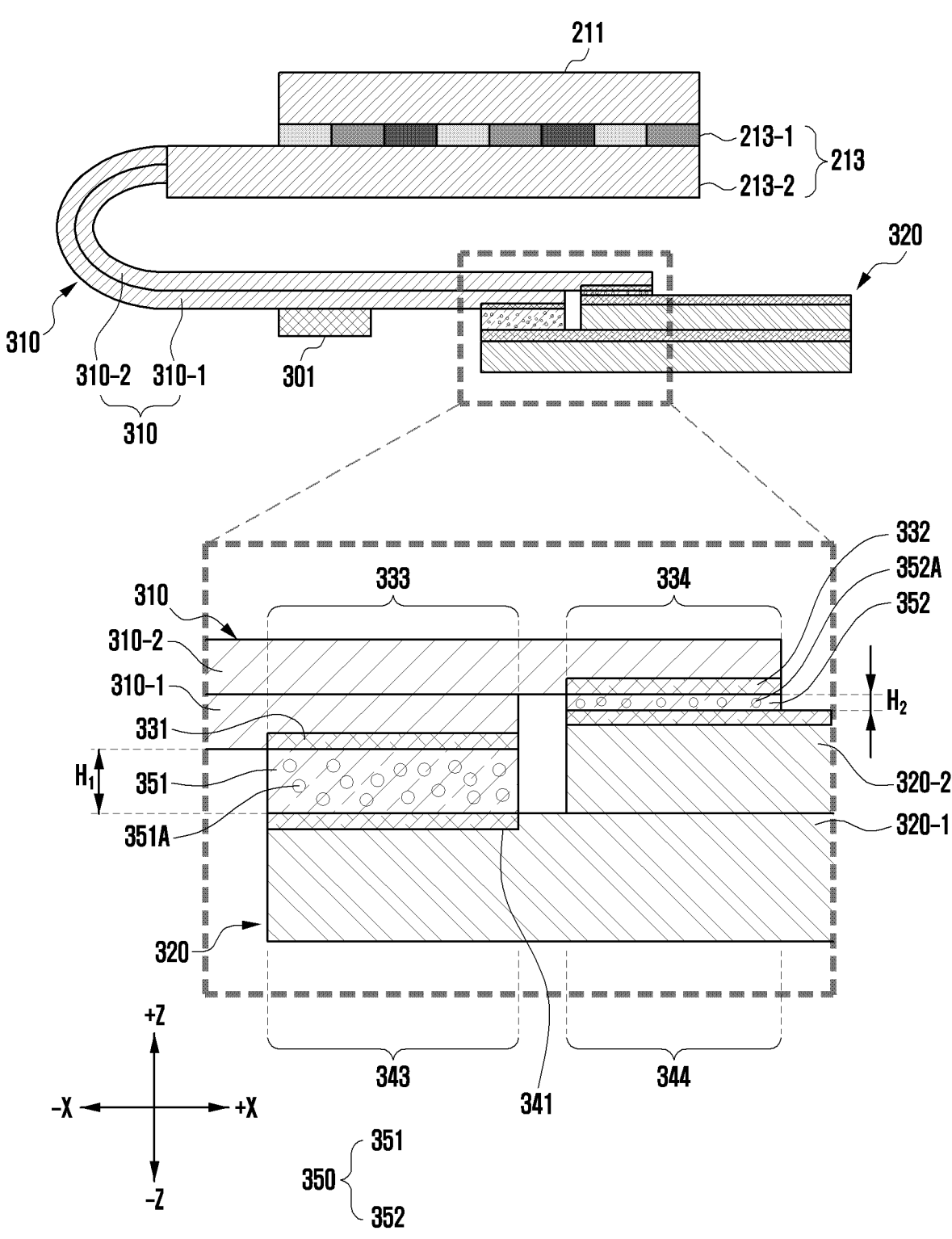
FIG. 6 is a sectional view of a display panel, a first connection member, and a second connection member according to an embodiment of the disclosure.

FIG. 6 is a sectional view of a display panel, a first connection member, and a second connection member according to an embodiment of the disclosure.

Referring to FIG. 6, in connection with elements identical or similar to elements described above, the same member numerals may be used therefor, and detailed descriptions thereof may be omitted.

According to various embodiments of the disclosure, the first connection member 310 may include multiple layers. For example, the first connection member 310 may include a third layer 310-1 and a fourth layer 310-2. The first pad 331 and the second pad 332 included in the first connection member 310 may be arranged on different layers. For example, the first pad 331 may be disposed on the third layer 310-1, and the second pad 332 may be disposed on the fourth layer 310-2. The second pad 332 may be disposed on a layer different from that of the first pad 331, and thus may be spaced apart therefrom in the Z axis direction with reference to FIG. 6. In addition, the second pad 332 may be spaced apart with respect to the first pad 331 in the second direction (e.g., the +X axis direction of FIG. 6). The first pad 331 may constitute the first contact point part 333, and the second pad 332 may constitute the second contact point part 334. The first contact point part 333 may be formed on the third layer 310-1, and the second contact point part 334 may be formed on the fourth layer 310-2.

Referring to FIG. 6, the third contact point part 343 formed on the first layer 320-1 of the second connection member 320 and the first contact point part 333 formed on the third layer 310-1 of the first connection member 310 may be electrically connected to each other. The first contact point part 333 and the third contact point part 343 may be electrically connected by the first conductive member 351 disposed between the first contact point part 333 and the third contact point part 343. The fourth contact point part 344 formed on the second layer 320-2 of the second connection member 320 and the second contact point part 334 formed on the fourth layer 310-2 of the first connection member 310 may be electrically connected to each other. The second contact point part 334 and the fourth contact point part 344 may be electrically connected by the second conductive member 352 disposed between the second contact point part 334 and the fourth contact point part 344.

When the substrate of the display panel 213 and the first connection member 310 are integrally formed (e.g., the COP structure), the first contact point part 333 and the second contact point part 334 of the first connection member 310 may be formed on the same layer (e.g., the structure of FIG. 5). When the first connection member 310 is formed separately from the substrate of the display panel 213 (e.g., the COF structure), the first contact point part 333 and the second contact point part 334 of the first connection member 310 may be formed on different layers (e.g., the structure of FIG. 6). For example, it may be determined whether to form the first contact point part 333 and the second contact point part 334 on the same layer based on the width of the wire 311 formed on the first connection member 310.

In an embodiment of the disclosure, the distance H1 between the third contact point part 343 disposed on the first layer 320-1 of the second connection member 320 and the first contact point part 333 disposed on the third layer 310-1 of the first connection member 310 may be greater than the distance H2 between the fourth contact point part 344 disposed on the second layer 320-2 of the second connection member 320 and the second contact point part 334 disposed on the fourth layer 310-2 of the first connection member 310. For example, the thickness of the first conductive member 351 disposed between the first contact point part 333 and the third contact point part 343 may be thicker than the thickness of the second conductive member 352 disposed between the second contact point part 334 and the fourth contact point part 344.

In an embodiment of the disclosure, the thickness of the first conductive member 351 may be small when the first connection member 310 is formed separately from the substrate of the display panel 213 (e.g., the structure of FIG. 6) compared to the case where the substrate of the display panel 213 and the first connection member 310 are integrally formed (e.g., the structure of FIG. 5). For example, the thickness of the first conductive member 351 may be changed according to the thickness of the layer on which the first contact point part 333 is positioned among the multiple layers of the first connection member 310. For example, the conductive layer (e.g., the conductive layer 361 of FIG. 4) of the first connection member 310 may be formed to have a thickness of about 10-12 μm, and the adhesive layer (e.g., the adhesive layer 391 of FIG. 4) may be formed to have a thickness of about 100 μm.

In another embodiment of the disclosure, the thickness of the first conductive member 351 and the thickness of the second conductive member 352 may be formed to be substantially the same. For example, when the first connection member 310 and the second connection member 320 each are formed in multiple layers and connected, and the number of each of the layers is the same, the first conductive member 351 and the second conductive member 352 may be formed to have a thickness substantially the same. In an embodiment of the disclosure, although the thickness of the first conductive member 351 and the thickness of the second conductive member 352 are the same, the diameter (or size) of the first conductive ball 351A included in the first conductive member 351 and the diameter (or size) of the second conductive ball 352A included in the second conductive member 352 may be different from each other.

In the above description, although it is described that the first connection member 310 includes two contact point parts (e.g., the first contact point part 333 and second contact point part the 334) and the second connection member 320 includes two contact point parts (e.g., a third contact point part 343 and the fourth contact point part 344), the first connection member 310 and the second connection member 320 may be connected by three or more contact point parts. The multiple contact point parts may be spaced apart from each other in the X-axis direction with reference to FIG. 5 or FIG. 6. In addition, the multiple contact point parts may be formed on the same layer or different layers.

Figure 7A:
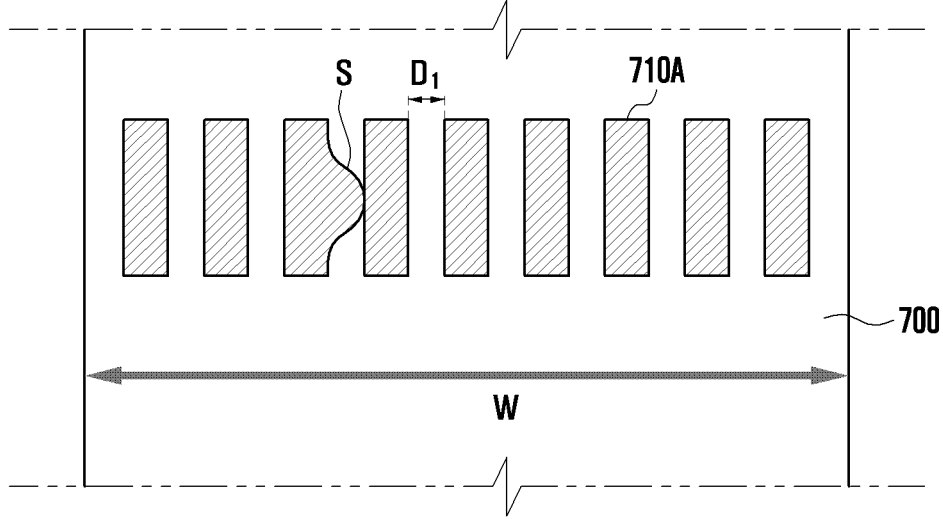
FIGS. 7A and 7B are views showing an effect of a display module according to various embodiments of the disclosure.
Figure 7B:
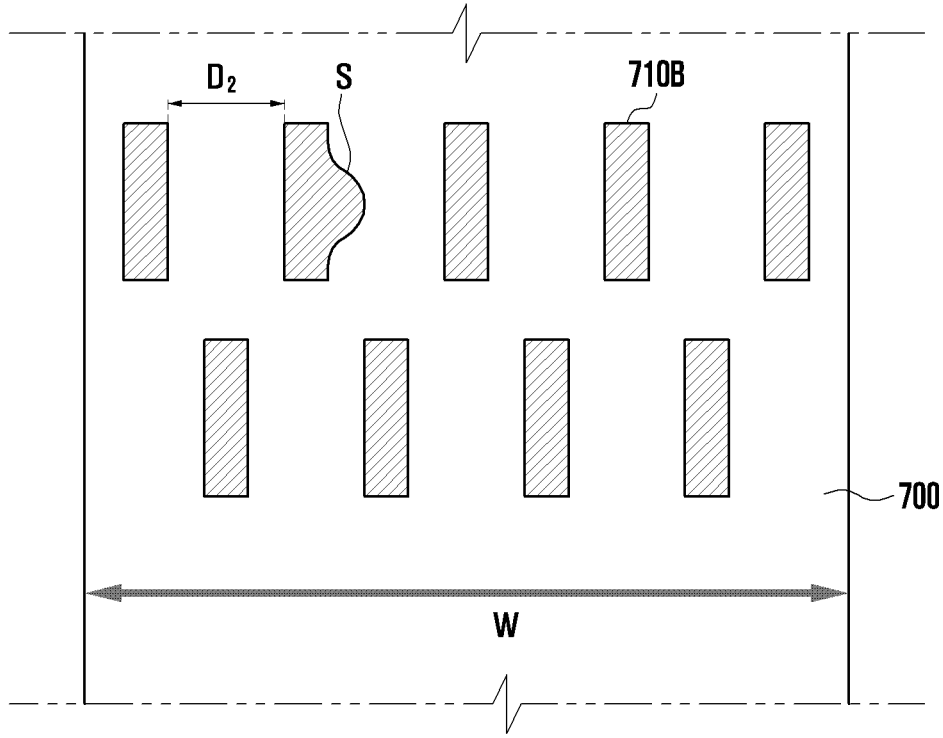

FIGS. 7A and 7B are views illustrating an effect of a display module according to various embodiments of the disclosure.

FIGS. 7A and 7B are schematic views illustrating forms in which pads 710A and 710B having the same number are arranged on a connection member 700 having the same width W.

FIG. 7A illustrates a case where the pads 710A are formed on one row, and FIG. 7B illustrates a case where the pads 710B are formed on multiple rows as various embodiments of the disclosure. The gaps D1 between the pads 710A of FIG. 7A are smaller than the gaps D2 between the pads 710B of FIG. 7B. Materials constituting the pads 710A and 710B may be eluted S due to various causes. For example, materials constituting the pads 710A and 710B may be eluted S due to factors, such as external impact and corrosion.

In the case of FIG. 7A, since the gaps D1 between the pads 710A are relatively small, short-circuit may occur due to the elution S between the pads 710A. Due to the short circuit between the pads 710A, the short-circuited portion may turn black, or in some cases, a defect may occur in a signal flow and, as a result, an issue may occur in an operation of the display module 210. In order to address the issue, what may be necessary to increase the width W of the connection member 700. In the case, an issue may occur that the mounting efficiency of the electronic device is reduced.

In the case of FIG. 7B as presented herein, since the gaps D2 between the pads 710B are relatively large, short-circuit may not easily occur between the pads 710B although elution S occurs. Therefore, the structure presented herein may have improved durability. In addition, it is possible to address the short-circuit issue due to elution without increasing the width of the connection member 700.

An electronic device (e.g., the electronic device 101 of FIG. 1) according to various embodiments disclosed herein may include a display panel (e.g., the window layer 211 of FIG. 2), a first connection member (e.g., the first connection member 310 of FIG. 3) which includes multiple wires (e.g., the wires 311 of FIG. 3) electrically connected to the display panel and on which a display driver integrated circuit (DDIC) (e.g., the display driver IC 301 of FIG. 3) configured to control the display panel is disposed, a first contact point part (e.g., the first contact point part 333 of FIG. 3) which includes multiple first pads (e.g., the first pads 331 of FIG. 3) electrically connected to some of the wires included in the first connection member and arranged in a first direction and is disposed on the first connection member, a second contact point part (e.g., the second contact point part 334 of FIG. 3) which includes multiple second pads (e.g., the second pads 332 of FIG. 3) electrically connected to other wires included in the first connection member and arranged in the first direction and is spaced apart from the first contact point part in a second direction perpendicular to the first direction and disposed on the first connection member, a second connection member (e.g., the second connection member 320 of FIG. 3) which includes a first layer (e.g., the first layer 320-1 of FIG. 3), a second layer (e.g., the second layer 320-2 of FIG. 3) laminated on the first layer, and multiple wires (e.g., the wires 321 of FIG. 3) arranged on each of the layers and is disposed adjacent to the first connection member, a third contact point part (e.g., the third contact point part 343 of FIG. 3) which includes multiple third pads (e.g., the third pads 341 of FIG. 3) electrically connected to some of the wires included in the second connection member and arranged in the first direction and is disposed on the first layer of the second connection member to be connected to the first contact point part, and a fourth contact point part (e.g., the fourth contact point part 344 of FIG. 3) which includes multiple fourth pads (e.g., the fourth pads 342 of FIG. 3) electrically connected to other wires included in the second connection member and arranged in the first direction and is disposed on the second layer of the second connection member to be connected to the second contact point part.

In addition, the first connection member may be integrally formed with a substrate of the display panel.

In addition, widths of the first pads and the second pads formed on the first connection member may be smaller than widths of the third pads and the fourth pads formed on the second connection member.

In addition, a conductive member (e.g., the conductive member 350 of FIG. 4) which includes a first conductive member (e.g., the first conductive member 351 of FIG. 4) disposed between the first contact point part and the third contact point part to electrically connect the first pads and the third pads, and a second conductive member (e.g., the second conductive member 352 of FIG. 4) disposed between the second contact point part and the fourth contact point part to electrically connect the second pads and the fourth pads, may be further included therein.

In addition, the first conductive member of the conductive member may include a first conductive ball (e.g., the first conductive ball 351A of FIG. 5), the second conductive member of the conductive member may include a second conductive ball (e.g., the second conductive ball 352A of FIG. 5), and the diameter of the first conductive ball may be larger than the diameter of the second conductive ball.

In addition, the first connection member may be formed separately from a substrate of the display panel and may be electrically connected to the substrate of the display panel.

In addition, the first connection member may include laminated multiple layers, and the first pads and the second pads may be respectively arranged on different layers among the multiple layers of the first connection member.

In addition, the first pads and the second pads may be portions through which a part of each of the multiple wires included in the first connection member is exposed, and the third pads and the fourth pads may be portions through which a part of each of the multiple wires included in the second connection member are exposed.

In addition, the first connection member and the second connection member may be formed of a flexible material.

In addition, the first connection member may have at least a portion bent to allow same to extend to the rear surface of the display panel.

A display module (e.g., the display module 210 of FIG. 2) according to various embodiments disclosed herein may include a display panel (e.g., the window layer 211 of FIG. 2), a first connection member (e.g., the first connection member 310 of FIG. 3) which includes multiple wires (e.g., the wires 311 of FIG. 3) electrically connected to the display panel and on which a display driver integrated circuit (DDIC) (e.g., the display driver IC 301 of FIG. 3) configured to control the display panel is disposed, a first contact point part (e.g., the first contact point part 333 of FIG. 3) which includes multiple first pads (e.g., the first pads 331 of FIG. 3) electrically connected to some of the wires included in the first connection member and arranged in a first direction and is disposed on the first connection member, a second contact point part (e.g., the second contact point part 334 of FIG. 3) which includes multiple second pads (e.g., the second pads 332 of FIG. 3) electrically connected to other wires included in the first connection member and arranged in the first direction and is spaced apart from the first contact point part in a second direction perpendicular to the first direction and disposed on the first connection member, a second connection member (e.g., the second connection member 320 of FIG. 3) which includes a first layer (e.g., the first layer 320-1 of FIG. 3), a second layer (e.g., the second layer 320-2 of FIG. 3) laminated on the first layer, and multiple wires (e.g., the wires 321 of FIG. 3) arranged on each of the layers and is disposed adjacent to the first connection member, a third contact point part (e.g., the third contact point part 343 of FIG. 3) which includes multiple third pads (e.g., the third pads 341 of FIG. 3) electrically connected to some of the wires included in the second connection member and arranged in the first direction and is disposed on the first layer of the second connection member to be connected to the first contact point part, and a fourth contact point part (e.g., the fourth contact point part 344 of FIG. 3) which includes multiple fourth pads (e.g., the fourth pads 342 of FIG. 3) electrically connected to other wires included in the second connection member and arranged in the first direction and is arranged on the second layer of the second connection member to be connected to the second contact point part.

In addition, the first connection member may be integrally formed with a substrate of the display panel.

In addition, the widths of the first pads and the second pads formed on the first connection member may be smaller than the widths of the third pads and the fourth pads formed on the second connection member.

In addition, a conductive member (e.g., the conductive member 350 of FIG. 4) which includes a first conductive member (e.g., the first conductive member 351 of FIG. 4) disposed between the first contact point part and the third contact point part and configured to electrically connect the first pads and the third pads, and a second conductive member (e.g., the second conductive member 352 of FIG. 4) disposed between the second contact point part and the fourth contact point part and configured to electrically connect the second pads and the fourth pads, may be further included therein.

In addition, the first conductive member of the conductive member may include a first conductive ball (e.g., the first conductive ball 351A of FIG. 5), the second conductive member of the conductive member may include a second conductive ball (e.g., the second conductive ball 352A of FIG. 5), and the diameter of the first conductive ball may be larger than the diameter of the second conductive ball.

In addition, the first connection member may be formed separately from a substrate of the display panel and may be electrically connected to the substrate of the display panel.

In addition, the first connection member may include laminated multiple layers, and the first pads and the second pads may be respectively arranged on different layers among the multiple layers of the first connection member.

In addition, the first pads and the second pads may be portions through which a part of each of the multiple wires included in the first connection member are exposed, and the third pads and the fourth pads may be portions through which a part of each of the multiple wires included in the second connection member are exposed.

In addition, the first connection member may have at least a portion bent to allow same to extend to the rear surface of the display panel.

An electronic device (e.g., the electronic device 101 of FIG. 1) according to various embodiments disclosed herein may include a display panel (e.g., the window layer 211 of FIG. 2), a first connection member (e.g., the first connection member 310 of FIG. 3) which includes multiple wires (e.g., the wires 311 of FIG. 3) electrically connected to the display panel and on which a display driver integrated circuit (DDIC) (e.g., the display driver IC 301 of FIG. 3) configured to control the display panel is disposed, and a second connection member (e.g., the second connection member 320 of FIG. 3) which includes a first layer (e.g., the first layer 320-1 of FIG. 3), a second layer (e.g., the second layer 320-2 of FIG. 3) laminated on the first layer, and multiple wires (e.g., the wires 321 of FIG. 3) arranged on each of the layers and is disposed adjacent to the first connection member, wherein the first connection member may include a first contact point part (e.g., the first contact point part 333 of FIG. 3) which includes multiple first pads (e.g., the first pads 331 of FIG. 3) electrically connected to some of the wires included in the first connection member and arranged in a first direction and is disposed on the first connection member, and a second contact point part (e.g., the second contact point part 334 of FIG. 3) which includes multiple second pads (e.g., the second pads 332 of FIG. 3) electrically connected to other wires included in the first connection member and arranged in the first direction and is spaced apart from the first contact point part in a second direction perpendicular to the first direction and disposed on the first connection member, and the second connection member may include a third contact point part (e.g., the third contact point part 343 of FIG. 3) which includes multiple third pads (e.g., the third pads 341 of FIG. 3) electrically connected to some of the wires included in the second connection member and arranged in the first direction and is disposed on the first layer of the second connection member to be connected to the first contact point part, and a fourth contact point part (e.g., the fourth contact point part 344 of FIG. 3) which includes multiple fourth pads (e.g., the fourth pads 342 of FIG. 3) electrically connected to other wires included in the second connection member and arranged in the first direction and is arranged on the second layer of the second connection member to be connected to the second contact point part.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:

a display panel;

a first connection member which comprises multiple wires electrically connected to the display panel and on which a display driver integrated circuit (DDIC) configured to control the display panel is disposed, the first connection member comprising:

a first contact portion which comprises multiple first pads electrically connected to some of the wires included in the first connection member and arranged in a first direction and is disposed on the first connection member, and a second contact portion which comprises multiple second pads electrically connected to other wires included in the first connection member and arranged in the first direction and is spaced apart from the first contact portion in a second direction perpendicular to the first direction and disposed on the first connection member; and a second connection member which comprises a first layer, a second layer laminated on the first layer, and multiple wires arranged on each of the layers and is disposed adjacent to the first connection member, the second connection member comprising:

a third contact portion which comprises multiple third pads electrically connected to some of the wires included in the second connection member and arranged in the first direction and is disposed on the first layer of the second connection member to be connected to the first contact portion, and a fourth contact portion which comprises multiple fourth pads electrically connected to other wires included in the second connection member and arranged in the first direction and is arranged on the second layer of the second connection member to be connected to the second contact portion, wherein the first pads and the second pads are portions configured to allow a part of each of the multiple wires included in the first connection member to be exposed therethrough, and wherein the third pads and the fourth pads are portions configured to allow a part of each of the multiple wires included in the second connection member to be exposed therethrough.

2. The electronic device of claim 1, wherein the first connection member is integrally formed with a substrate of the display panel.

3. The electronic device of claim 1, wherein widths of the first pads and the second pads formed on the first connection member are smaller than widths of the third pads and the fourth pads formed on the second connection member.

4. The electronic device of claim 1, further comprising: a conductive member which comprises:

a first conductive member disposed between the first contact portion and the third contact portion and configured to electrically connect the first pads and the third pads, and

a second conductive member disposed between the second contact portion and the fourth contact portion and configured to electrically connect the second pads and the fourth pads.

5. The electronic device of claim 4, wherein the first conductive member of the conductive member comprises a first conductive ball, wherein the second conductive member of the conductive member comprises a second conductive ball, and wherein a diameter of the first conductive ball is larger than a diameter of the second conductive ball.

6. The electronic device of claim 1, wherein the first connection member is formed separately from a substrate of the display panel and is electrically connected to the substrate of the display panel.

7. The electronic device of claim 6, wherein the first connection member comprises laminated multiple layers, and wherein the first pads and the second pads are respectively arranged on different layers among the multiple layers of the first connection member.

8. The electronic device of claim 1, wherein the first connection member and the second connection member are formed of a flexible material.

9. The electronic device of claim 1, wherein the first connection member has at least a portion bent to allow the first connection member to extend to a rear surface of the display panel.

10. A display module comprising:

a display panel;

a first connection member which comprises multiple wires electrically connected to the display panel and on which a display driver integrated circuit (DDIC) configured to control the display panel is disposed, the first connection member comprising:

a first contact portion which comprises multiple first pads electrically connected to some of the wires included in the first connection member and arranged in a first direction and is disposed on the first connection member, and a second contact portion which comprises multiple second pads electrically connected to other wires included in the first connection member and arranged in the first direction and is spaced apart from the first contact portion in a second direction perpendicular to the first direction and disposed on the first connection member; and a second connection member which comprises a first layer, a second layer laminated on the first layer, and multiple wires arranged on each of the layers and is disposed adjacent to the first connection member, the second connection member comprising:

a third contact portion which comprises multiple third pads electrically connected to some of the wires included in the second connection member and arranged in the first direction and is disposed on the first layer of the second connection member to be connected to the first contact portion; and a fourth contact portion which comprises multiple fourth pads electrically connected to other wires included in the second connection member and arranged in the first direction and is arranged on the second layer of the second connection member to be connected to the second contact portion, wherein the first pads and the second pads are portions configured to allow a part of each of the multiple wires included in the first connection member to be exposed therethrough, and wherein the third pads and the fourth pads are portions configured to allow a part of each of the multiple wires included in the second connection member to be exposed therethrough.

11. The display module of claim 10, wherein the first connection member is integrally formed with a substrate of the display panel.

12. The display module of claim 10, wherein widths of the first pads and the second pads formed on the first connection member are smaller than widths of the third pads and the fourth pads formed on the second connection member.

13. The display module of claim 10, further comprising a conductive member which comprises:

a first conductive member disposed between the first contact portion and the third contact portion and configured to electrically connect the first pads and the third pads, and a second conductive member disposed between the second contact portion and the fourth contact portion and configured to electrically connect the second pads and the fourth pads.

14. The display module of claim 13, wherein the first conductive member of the conductive member comprises a first conductive ball, wherein the second conductive member of the conductive member comprises a second conductive ball, and wherein a diameter of the first conductive ball is larger than a diameter of the second conductive ball.

15. The display module of claim 10, wherein the first connection member is formed separately from a substrate of the display panel and is electrically connected to the substrate of the display panel.

16. The display module of claim 15, wherein the first connection member comprises laminated multiple layers, and wherein the first pads and the second pads are respectively arranged on different layers among the multiple layers of the first connection member.

17. The display module of claim 10, wherein the first connection member has at least a portion bent to allow the first connection member to extend to a rear surface of the display panel.

* * * * *